(12) United States Patent
Lee

(10) Patent No.: US 7,088,005 B2
(45) Date of Patent: Aug. 8, 2006

(54) WAFER STACKING WITH ANISOTROPIC CONDUCTIVE ADHESIVE

(75) Inventor: Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/749,890

(22) Filed: Dec. 31, 2003

(65) Prior Publication Data

US 2005/0146053 A1 Jul. 7, 2005

(51) Int. Cl.
*H01L 23/48* (2006.01)

(52) U.S. Cl. ........................ 257/783; 438/116; 438/108; 438/119

(58) Field of Classification Search ................ 428/323, 428/402, 402.24, 403, 407; 438/116, 119, 438/108
See application file for complete search history.

(56) References Cited

U.S. PATENT DOCUMENTS 6,767,763 B1 * 7/2004 Uchiyama ................... 438/116
6,777,071 B1 * 8/2004 Cobbley et al. ............ 428/323

* cited by examiner

*Primary Examiner*—Mai-Huong Tran
(74) *Attorney, Agent, or Firm*—George Chen

(57) ABSTRACT

The present invention includes a method that provides a first wafer; forms a first raised contact from a first plug on the first wafer; provides a second wafer; forms a second raised contact from a second plug on the second wafer; applies an anisotropic conductive adhesive over the first wafer; aligns the second wafer to the first wafer; attaches the second wafer to the anisotropic conductive adhesive to form a continuous and conductive path between the first raised contact and the second raised contact.

The present invention also includes a structure that has an anisotropic conductive film, the anisotropic conductive film has a front surface and a rear surface; a first raised contact is located over the front surface, the first raised contact forming part of a first wafer; and a second raised contact located over the rear surface, the second raised contact forming part of a second wafer, where the second raised contact faces the first raised contact.

15 Claims, 3 Drawing Sheets

WAFER STACKING WITH ANISOTROPIC CONDUCTIVE ADHESIVE

BACKGROUND OF THE INVENTION

1. Field of the Invention

The present invention relates to the field of semiconductor integrated circuit (IC) manufacturing, and more specifically, to a method of stacking wafers with anisotropic conductive adhesive and a stacked-wafer structure having anisotropic conductive adhesive.

2. Discussion of Related Art

In 1965, Gordon Moore first observed that the number of devices per area on a chip appeared to double approximately every 18 months. Ever since then, the semiconductor industry has managed to introduce new designs and processes on schedule to deliver the improvement in device density projected by Moore's Law. In particular, major enhancements in photolithography have reduced the minimum dimension that can be successfully patterned in a feature on the chip. At the same time, significant improvements in doping, deposition, and etch have enhanced the precision that concentration, depth, and thickness can be controlled across the chip.

As device dimensions approach atomic dimensions, the fundamental limitations of physics play increasingly larger roles in determining the performance and reliability of the devices on the chip. In the past, scaling of the chip has been accomplished by shrinking the dimensions of each device within the chip as well as shrinking the dimensions of the interconnections among the devices.

However, it is becoming increasingly important to balance the scaling within the chip with the scaling of the electrical connections between various chips that may be fabricated on various substrates.

BRIEF DESCRIPTION OF THE DRAWINGS

FIGS. 1A–1K is also an illustration of a cross-sectional view of various embodiments of a stacked-wafer structure having anisotropic conductive adhesive according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Two or more substrates may be stacked and electrically connected with anisotropic conductive adhesive (ACA) according to the present invention. In an embodiment of the present invention, the substrates may be structurally similar (with regards to materials, layers, thicknesses, dimensions, and physical interconnections). In an embodiment of the present invention, the substrates may be pre-thinned, such as to a thickness selected from a range of about 20–100 microns (um).

In another embodiment of the present invention, the substrates may be functionally similar (with regard to operation of underlying devices and equivalent electrical circuitry). The devices may be active, including transistors, or passive, including capacitors, inductors, and resistors.

In still another embodiment of the present invention, the substrates may be structurally and functionally dissimilar.

In various embodiments of the present invention, the substrates may be stacked front-to-front (to be shown), front-to-rear (not shown), or rear-to-rear (not shown). The raised contacts may be on the front, on the rear, or on both the front and the rear of the substrate.

In an embodiment of the present invention, interposers may be used to stack two or more wafers. Wafer-level packaging (WLP) may be involved. In another embodiment of the present invention, the stacked structure may form a portion of a multichip module (MCM).

In an embodiment of the present invention, the substrate 102 may be a wafer. In another embodiment of the present invention, the substrate 102 may be a portion of a wafer. The portion of the wafer may include two or more die.

Various embodiments of a method of stacking wafers with ACA will be described first, followed by various embodiments of a stacked-wafer structure with ACA. Some embodiments of a method of stacking wafers with ACA according to the present invention are shown in FIGS. 1A–K.

Figure 1A:
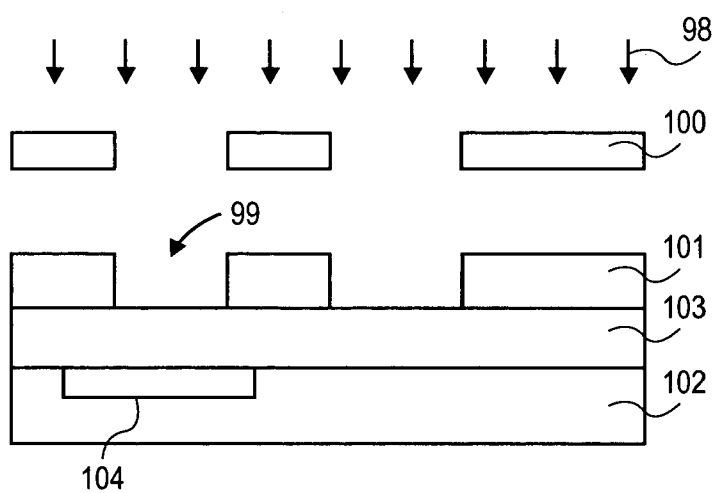
FIGS. 1A–K are illustrations of a cross-sectional view of various embodiments of a method of stacking wafers with anisotropic conductive adhesive according to the present invention.
Figure 1B:
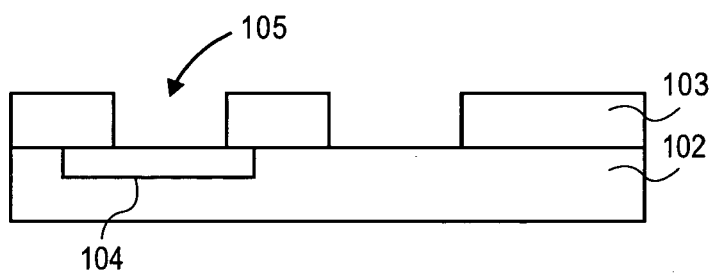

A substrate 102 may include a bond pad 104, as shown in an embodiment of the present invention in FIG. 1A. The bond pad 104 may permit input of a signal to, or output of a signal from, a device (not shown) in the substrate 102.

The device (not shown) may be formed by modifying, adding, or removing various materials in and on the substrate 102 by using a combination of processes such as oxidation, deposition, ion implantation, thermal processing, patterning, and etching. The materials in the substrate and the materials that may be added to, or removed from, the substrate may include semi-conducting material, such as silicon, insulating material, such as oxide or nitride, and conducting material, such as doped polysilicon or metal.

The bond pad 104 may be formed from an electrically conducting material having a thickness selected from a range of about 0.25–1.2 um. The electrically conducting material may include a metal, such as Aluminum or Copper, or an alloy.

The substrate 102 may be covered with an insulator 103 formed from an electrically insulating material having a thickness selected from a range of about 0.5–2.4 um. The electrically insulating material may include an undoped silicon oxide, having a dielectric constant, k, with a value such as 3.9–4.2. The insulator 103 may serve as an interlayer dielectric (ILD) to separate the bond pad 104 from other electrically conducting materials in an underlying layer (not shown) or in an overlying layer (not shown).

Capacitance in the electrically conducting material in and on the substrate 102 may be reduced by using a low-k material for some to form some or all of the insulator 103 between the electrically conducting materials. Low-k refers to a value of k that is lower than the value of k of undoped silicon oxide. A fluorinated silicate glass (FSG or SiOF), having k with a value such as 3.4–3.7 may be used. Alternatively, a carbon-doped silicon oxide (CDO or SiOC), having k with a value such as 2.9–3.2, may be used.

Materials having k with a value such as 2.4–2.7, may also be used. Such materials may be porous, including aerogels and xerogels, and may require the use of a capping layer (not shown) around the insulator 103 to prevent diffusion, intermixing, or reaction with other materials. In one embodiment, the capping layer may include silicon nitride ($Si_3N_4$), or silicon oxynitride (SiON).

The insulator 103 may be formed in a reactor by using chemical vapor deposition (CVD), such as plasma-enhanced CVD (PECVD). Alternatively, the insulator 103 may be a spin-on dielectric (SOD) formed on a track from a liquid source. In some cases, the SOD may require the use of an adhesion layer (not shown).

Photolithography may be used to pattern a mask in a radiation-sensitive material for subsequent etch. First, the radiation-sensitive material, such as photoresist 101, is applied over the insulator 103 of the substrate 102. As shown in an embodiment of the present invention in FIG. 1A, a feature 99 is then formed in the photoresist 101 by exposure to radiation 98 of the appropriate energy, wavelength, and dose, as modulated by a reticle 100, followed by development to form the mask. The radiation 98 may be provided by a illumination source, such as a lamp, a laser, or an electron beam. The exposure may be performed in an imaging system, such as a contact printer, a projection aligner, a wafer stepper, or a wafer scanner.

The feature 99 patterned in the photoresist 101 mask may then be transferred into an opening 105 in the underlying insulator 103 by an etch process. The etch process to form the opening 105 may include a plasma etch process or a reactive ion etch (RIE) process. The opening 105 uncovers a portion of the bond pad 104 of the device (not shown) in the substrate 102, as shown in an embodiment of the present invention in FIG. 1B.

The opening 105 may include shapes and dimensions that are derived from a design and a layout of the reticle 100. In an embodiment of the present invention, the opening 105 may be a via or a trench with an aspect ratio of a depth (vertical dimension) to a width (lateral dimension) of about 3:1 to about 10:1.

If etch selectivity or a ratio of etch rate of the insulator 103 to etch rate of the photoresist 101 mask is not high enough, a hard mask (not shown) with a lower etch rate than photoresist 101 may be included between the upper surface of the insulator 103 and the lower surface of the photoresist 101. In such a case, a first etch process is used to transfer a feature 99 that is patterned in the photoresist 101 into a corresponding feature in the underlying hard mask (not shown). Then, a second etch process transfers the corresponding feature from the hard mask (not shown) into the underlying insulator 103 to form the opening 105. A hard mask may include a material such as $Si_3N_4$, or SiON.

If etch selectivity or a ratio of etch rate of the insulator 103 to etch rate of the underlying bond pad 104 is not high enough, an etch stop layer (not shown) with a lower etch rate than the underlying bond pad 104 may be included between the upper surface of the bond pad 104 and the lower surface of the insulator 103. The etch stop layer may include a material such as $Si_3N_4$ or Silicon Carbide (SiC). If desired, an etch stop layer having a k with a lower value, such as 3.0–4.0 may be used to reduce the capacitance of the electrically conducting material in and on the substrate 102.

A barrier layer 115 is formed over the insulator 103 as a liner over the sidewalls of the opening 105 without completely filling in the opening 105. The barrier layer 115 may have a thickness selected from a range of about 50–600 Angstroms. The barrier layer 115 should block diffusion from an overlying seed layer 120 into the underlying insulator 103 or the underlying substrate 102.

The barrier layer 115 may include an electrically conducting material, such as a metal or an alloy. In one embodiment, the barrier layer 115 may include a lower layer of Tantalum Nitride (TaN) to adhere to the underlying insulator 103 and an upper layer of Tantalum Ta) to adhere to the overlying seed layer 120. Such a bilayer may have a total thickness of about 150–350 Angstroms.

If the aspect ratio of the opening 105 is about 5:1 or greater, better coverage of the sidewalls of the opening 105 may be achieved by forming the barrier layer 115 with ionized physical vapor deposition (I-PVD). Alternatively, the barrier layer 115 may be formed by using metal-organic CVD (MOCVD). When a thickness of about 100 Angstroms or less is desired, a better uniformity in thickness may be achieved by forming the barrier layer 115 with atomic-layer deposition (ALD).

Figure 1C:
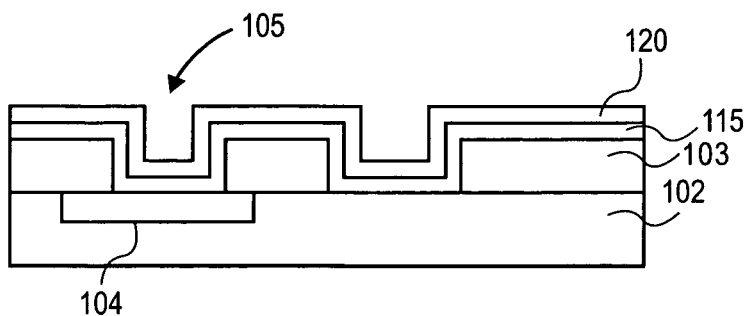

When the conductor 130 is to be subsequently formed by an electrochemical process, such as electroplating, a seed layer 120 is initially formed over the barrier layer 115, as shown in an embodiment of the present invention in FIG. 1C. In order to serve as a base for electroplating, the seed layer 120 should be electrically conducting with continuous coverage over the barrier layer 115. The seed layer 120 may include a metal, such as Copper, or an alloy. The seed layer 120 typically has a thickness selected from a range of about 20–2,500 Angstroms. The seed layer 120 may be formed by I-PVD, CVD, ALD, or electroless plating.

Figure 1D:
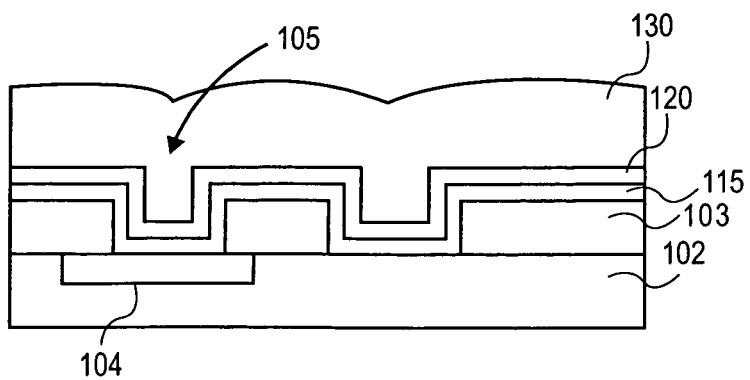
Figure 1E:
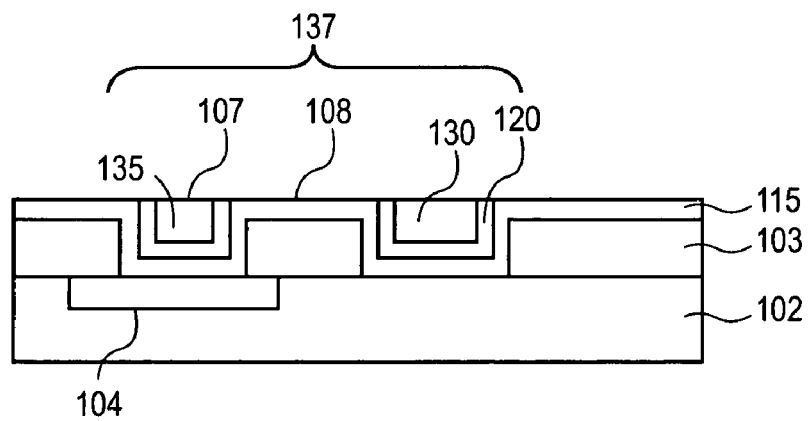

A conductor 130, is formed over the seed layer 120 to completely fill in the opening 105, as shown in an embodiment of the present invention in FIG. 1D. The conductor 130 includes a material that is electrically conducting. The conductor 130 may include a metal, such as Copper, or an alloy. The conductor 130 and the seed layer 120 may be formed from different materials. The conductor 130 typically has a thickness of about 0.2–2.8 um.

When the conductor 130 is to be subsequently formed by a non-electrochemical process, such as PVD or CVD, including MOCVD, the conductor 130 may be formed directly over the barrier layer 115, without first forming a seed layer 120 over the barrier layer 115.

During or after formation of the conductor 130, a treatment may be used to modify bulk properties or surface properties of the conductor 130. The treatment of the conductor 130 may include rapid thermal anneal (RTA) after deposition to modify or stabilize the grain size of the conductor 130.

The conductor 130 may include copper having a resistivity of about 1.0–4.0 micro-ohm-centimeter. Depending on the deposition conditions, nominal thickness, and anneal conditions, copper that has been formed by electroplating may have a grain size of about 0.1–1.0 millimeter (mm). A larger grain size in the conductor 130 may correspond to a lower resistivity.

A contact for the substrate 102 may be formed by first planarizing the conductor 130. Removal of the conductor 130 across the substrate 102 to uncover an upper surface 108 of the barrier layer 115 will leave behind a plug 135 that is inset or inlaid in the opening 105, as shown in an embodiment of the present invention in FIG. 1E.

Figure 1F:
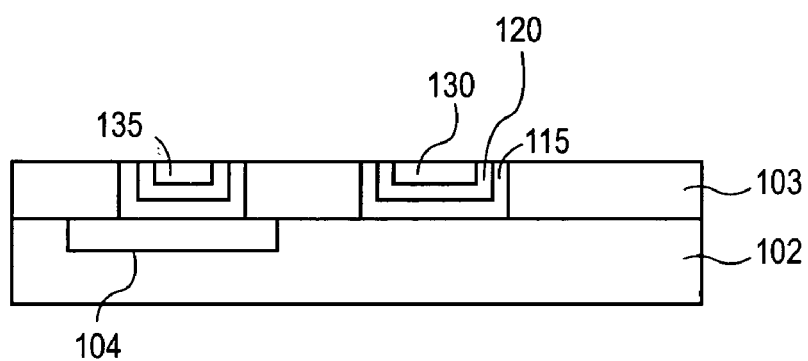
Figure 1G:
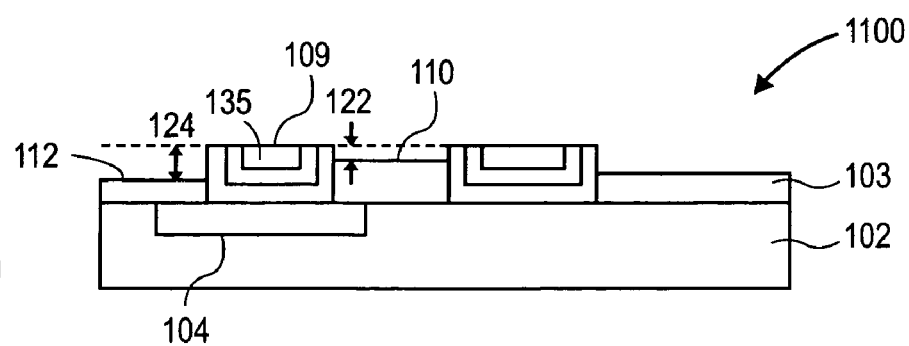

Next, the barrier layer 115 outside the plug 135 is removed to expose the underlying insulator 103, as shown in an embodiment of the present invention in FIG. 1F. The plug 135 may include portions of the conductor 130, the seed layer 120, and the barrier layer 115. The shape and dimensions of the plug 135 may be influenced by the shape and dimensions of the opening 105. In one embodiment of the present invention, the plug 135 may be a post or a stud when the opening 105 is a via. In another embodiment of the present invention, the plug 135 may be a line when the opening 105 is a trench.

A raised contact may then be formed from the plug 135 by a partial and uniform recession of the surrounding insulator 103. Recessing the insulator 103 by an amount that is less than an amount that the conductor 130 is thinned will result in a net protrusion of the plug 135 above an upper surface of the insulator 103, as shown in an embodiment of the present invention in FIG. 1G.

In an embodiment of the present invention, one or more chemical-mechanical polishing (CMP) processes may be used to planarize and recess various materials. CMP combines abrasion (mechanical forces) with dissolution (chemical or electrochemical reactions).

In another embodiment of the present invention, RIE may be used to planarize the conductor 130 and recess the insulator 103. RIE may be performed with a mask formed from photoresist or an etch-resistant material.

The recession of the insulator 103 surrounding the plug 135, such as between an interior location compared to an exterior location, may not be uniform. An interior location refers to an area within a cluster or an array 137 of two or more plugs. A plug relief 122 is an amount of protrusion of a polished upper surface 109 of the plug 135 relative to an interior upper surface 110 of the insulator 103. The nominal value of the plug relief 122 may be selected from a range of about 0.03–0.30 um.

An exterior location refers to an area outside the cluster or the array 137 of two or more plugs. A step height 124 is an amount of protrusion of the polished upper surface 109 of the plug 135 relative to an exterior upper surface 112 of the insulator 103. The nominal value of the step height 124 may be selected from a range of about 0.04–0.60 um.

In one embodiment of the present invention, the plug relief 122 may be about 0.10–0.20 um. In another embodiment of the present invention, the step height 124 may be about 0.15–0.40 um. In still another embodiment of the present invention, the plug relief 122 may be about the same as the step height 124.

The step height 124 should be about 50.0% or less of the initial thickness of the insulator 103. The plug relief 122 should be controlled more tightly than the step height 124. In one embodiment of the present invention, the plug relief 122 has a range across the substrate 100 of 8.0% or less while the step height 124 has a range across the substrate 100 of 12.0% or less.

An insulator relief, such as an oxide relief, for the cluster or the array 137 of two or more plugs is a difference between the plug relief 122 and the step height 124. Minimizing the insulator relief, such as the oxide relief, may permit a desired plug relief 122 to be achieved from a thinner initial thickness for the insulator 103.

A field region refers to the exterior locations that are relatively distant from the clusters or the arrays 137 of two or more plugs. In an embodiment of the present invention, the insulator relief relative to the field region may be different from, and is usually larger than, the insulator relief relative to the exterior locations that are very close to the cluster or the array 137 of two or more plugs.

Figure 1H:
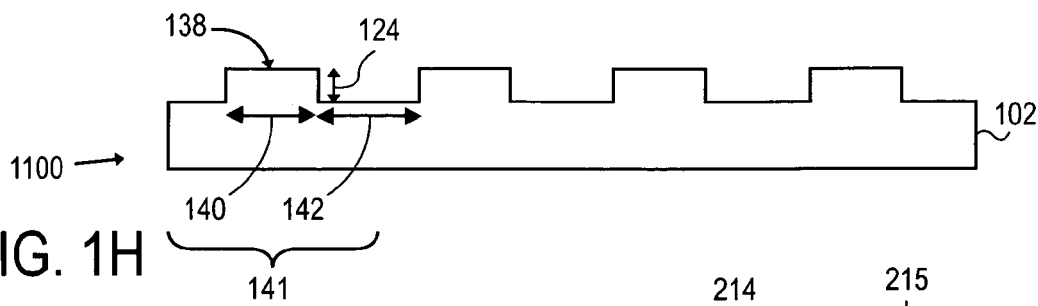

The plug 135 on the substrate 102 protrudes above the insulator 103 and may form part of a first raised contact 138 on a first wafer 1100, as shown in an embodiment of the present invention in FIG. 1H.

Next, the first wafer 1100 may be pretreated, Pretreatment may be performed to clean and condition a surface of the raised contact 138 to improve adhesion. Pretreatment may remove contamination, such as organic residues, and etch surface layers, such as oxides. Pretreatment may also modify or roughen the surface of the raised contact 138. Pretreatment may include one or more processes, such as wet processing, prebaking, and plasma treatment.

Then, an anisotropic conductive adhesive (ACA) is applied over the first wafer 1100, including the first raised contact 138. In an embodiment of the present invention, the ACA is applied in the form of an anisotropic conductive paste (ACP). The ACP may be mixed, stirred, and dispensed over the first wafer 1100. Neither pressure nor heat is usually applied to the ACP after dispensing. Generation of bubbles or voids at an interface between a front surface of the ACP and the first wafer 1100 should be avoided.

Figure 1I:
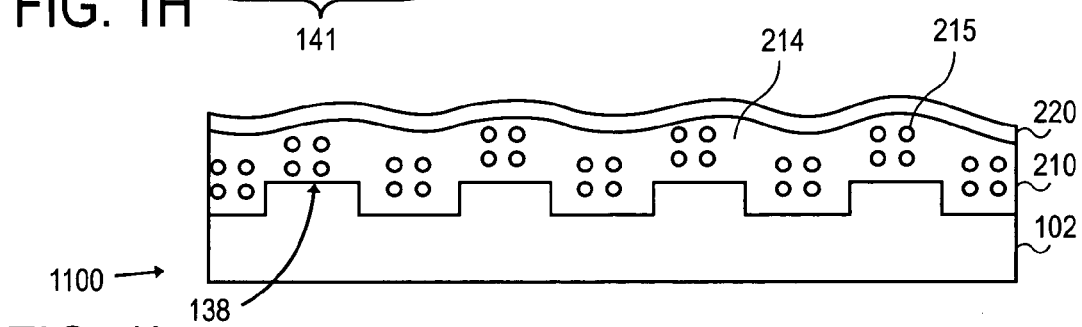

In another embodiment of the present invention, the ACA is applied in the form of an anisotropic conductive film (ACF) 210, as shown in FIG. 1I. Previously slit to a desired width, the ACF 210 may be unrolled from a reel, cut to a desired length, and laminated over the first wafer 1100, such as with a bondhead on a bonder tool.

In an embodiment of the present invention, lamination may include applying a light pressure, such as about 0.2–0.3 MegaPascals (MPa), for a short duration, such as about 3–5 seconds, with a low heat, such as at a temperature selected from a range of about 90–100 degrees Centigrade. Generation of bubbles or voids at an interface between a front surface of the ACF 210 and the first wafer 1100 should be avoided.

Unlike the ACP, the ACF 210 has a release liner 220 attached to its rear surface to prevent the bondhead from adhering to the ACF 210 during the lamination process. The release liner 220, also known as a separator layer or a cover film, may be removed after the front surface of the ACF 210 is applied over the first wafer 1100.

In an embodiment of the present invention, the ACP or the ACF 210 may have a single layer that includes two or more components, as shown in FIG. 1I. One component may include a binder 214 that is adhesive and non-conductive. Another component may include a filler 215 that is conductive or potentially conductive.

In another embodiment of the present invention, the ACF 210 may have multiple layers (not shown). In still another embodiment of the present invention, the ACF 210 may have two layers (not shown). A first layer may include a binder 214 without a filler 215. A second layer may include a binder 214 and a filler 215. Thus, the first layer serves primarily to provide adhesion while the second layer serves primarily to provide conduction. By including the filler 215, the second layer may have a higher viscosity than the first layer. The second layer is on the front side of the ACF 210 while the first layer is on the rear side of the ACF 210, next to the release liner 220.

The binder 214 may act as an underfill when the processing is complete. Consequently, it is desirable to match a coefficient of thermal expansion (CTE) of the binder 214 reasonably closely to the CTE of the other materials on the first wafer 1100 in order to reduce any thermal stress that may be induced in the first wafer 1100 by a temperature excursion or a thermal gradient.

The other materials on the first wafer 1100 may include the substrate 102, the insulator 103, and the conductor 130, as shown in an embodiment of the present invention in FIG. 1F. The substrate 102, such as silicon, may have a CTE of about 24 parts per million (ppm)/ degree Kelvin (K). The insulator 103, such as silicon oxide, may have a CTE of about 5–12 ppm/K. Metals and alloys may have a CTE of about 4–29 ppm/K. The conductor 130, such as copper, may have a CTE of about 12–23 ppm/K. A solder bump, such as a lead-tin alloy, may have a CTE of about 23–29 ppm/K.

For comparison, a printed circuit board (not shown) may have a CTE of about 7–25 ppm/K, which is close to the CTE of the conductor 130. A printed circuit board with an inorganic substrate would be towards the lower end of the range for the CTE while a printed circuit board with an organic substrate would be towards the higher end of the range for the CTE.

The binder 214 may include a matrix. The matrix may include a polymer or a resin. The binder 214 for an ACP may be a thermoset, a thermoplastic, or a mixture of a thermoset and a thermoplastic. The binder 214 for an ACF 210 is usually a thermoset, such as an epoxy, a silicone, or a polyimide. Compared to the thermoplastic, the thermoset requires a higher pressure during processing and may be more difficult to rework. However, compared to the thermoplastic, the thermoset may be easier to handle and may provide higher reliability.

Thermoplastics may have a high CTE, such as about 34–160 ppm/K. Compared with thermoplastics, thermosets may have a lower CTE, such as about 10–100 ppm/K. Some filled thermosets may have a negative CTE, such as about −6 to −30 ppm/K. The binder 214 may have a CTE of about 12–20 ppm/K. The filler 215 may have a CTE of about 60–70 ppm/K. In an embodiment of the present invention, the ACF 210, such as a filled epoxy, may have a CTE of about 18–25 ppm/K.

The filler 215 may include particles that have a consistent shape. In one embodiment of the present invention, the particles may be spherical, or globular, with a diameter (D) that is uniform. The diameter may be a nominal or an equivalent diameter if the particles are not spherical or globular.

Spherical particles may slide more smoothly past each other (when not compressed) since, unlike some other shapes, such as flakes, they do not have sharp edges that may catch on each other. Spherical objects will also have a smaller surface area of contact (when not compressed) so they are less likely to clump together or settle out. These characteristics may be desirable for the filler 215 in the ACP or the ACF 210 so as to prevent forming a conductive path, especially laterally, which may lead to unintentional shorting.

In an embodiment of the present invention, the diameter of the particles in the ACP may be selected from a range of about 30–75 um. In another embodiment of the present invention, the diameter of the particles in the ACP may be selected from a range of about 12–30 um.

The particles in the ACF 210 may be smaller than the particles in the ACP. In an embodiment of the present invention, the diameter of the particles in the ACF 210 may be selected from a range of about 5–12 um. In another embodiment of the present invention, the diameter of the particles in the ACF 210 may be selected from a range of about 2–5 um.

The first raised contact 138 on the first wafer 1100 may have dimensions that include a step height (H) 124, a width (W) 140, and a gap (G) 142 from an adjacent contact, as shown in an embodiment of the present invention in FIG. 1H. In certain localized regions of the first wafer 1100, some of the raised contacts may be arranged in a cluster or an array with a period, or pitch (P), that is defined as a sum of the width and the gap (W+G).

Typical dimensions for wafers stacked with the ACP may be as follows. In a first embodiment of the present invention, H may have a value of about 0.25–2.50 um. In a second embodiment of the present invention, W may have a value of about 50–90 um. In a third embodiment of the present invention, G may have a value of about 50–110 um. In a fourth embodiment of the present invention, P may have a value of about 100–200 um. In an embodiment of the present invention, a ratio of (D/H) may be about 8 or more. In another embodiment of the present invention, a ratio of (D/W) may be about 0.8 or less. In still another embodiment of the present invention, a ratio of (D/G) may be about 1.0 or less.

Typical dimensions for wafers stacked with the ACF 210 may be as follows. In a first embodiment of the present invention, H may have a value of about 0.25–2.50 um. In a second embodiment of the present invention, W may have a value of about 20–45 um. In a third embodiment of the present invention, G may have a value of about 10–30 um. In a fourth embodiment of the present invention, P may have a value of about 30–75 um. In an embodiment of the present invention, a ratio of (D/ H) may be about 4 or more. In another embodiment of the present invention, a ratio of (D/W) may be about 0.3 or less. In still another embodiment of the present invention, a ratio of (D/G) may be about 0.5 or less.

In an embodiment of the present invention, the conductive particle may include a conductive bulk material, such as a metal or an alloy. The metal or alloy may include nickel.

In another embodiment of the present invention, the conductive particle may include a non-conductive bulk material, such as polystyrene, that is covered with a conductive outer layer, such as electroplated nickel-gold (Ni—Au).

In still another embodiment of the present invention, the potentially conductive particle may include a non-conductive bulk material, a conductive intermediate layer that covers the bulk material, and a non-conductive outer layer that covers the conductive intermediate layer. At the appropriate time, the non-conductive outer layer may be moved aside or removed with pressure and heat (thermocompression) so as to allow the particle to become conductive. Thus, anisotropic application of pressure in a certain direction will result in anisotropic conductivity in the same direction.

The concentration, or loading, of the filler 215 in the ACP or the ACF 210 should be controlled so that, after curing, conductivity will be anisotropic (in the z-direction only). In an embodiment of the present invention, the loading of the filler 215 may be selected from a range of about 1–15% by volume in the ACP or the ACF 210.

The distribution, or dispersion, of the filler 215 is random in the ACP and either random or ordered in the ACF 210. The dispersion of the filler 215 in the ACF 210 is usually more uniform than in the ACP since the filler 215 in the ACP may clump together or settle out. In an embodiment of the present invention, the filler 215 in the ACP should have a density that is close to a density of the binder 214 so that the filler 215 will not settle out. In another embodiment of the present invention, the filler 215 in the ACP should have a density that is close to 1 which is the density of water.

Figure 1J:
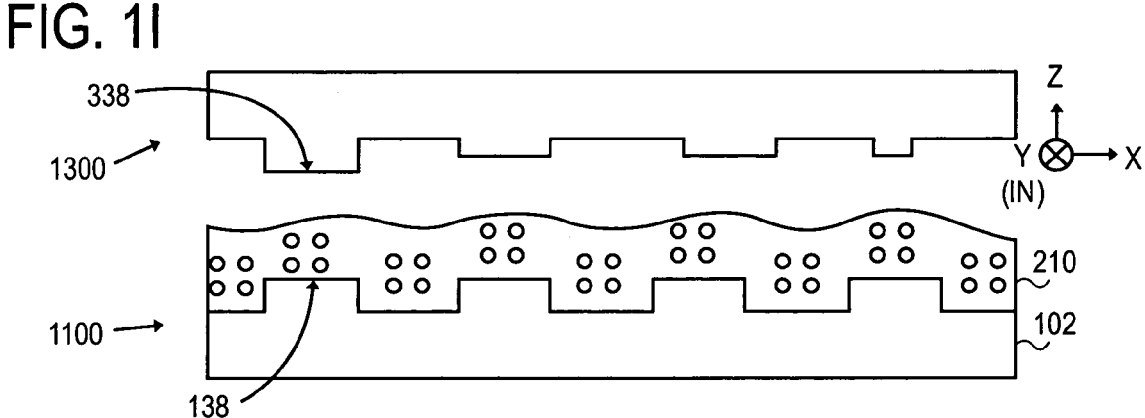

Next, a front surface of a second wafer 1300 is aligned to the front surface of the first wafer 1100 in both an x-direction and a y-direction, as shown in an embodiment of the present invention in FIG. 1J. The x-direction and the y-direction lie in the plane of the ACP or the ACF 210.

In another embodiment (not shown) of the present invention, a rear surface of the second wafer 1300 may be aligned to the front surface of the first wafer 1100. In still another embodiment (not shown) of the present invention, a rear surface of the second wafer 1300 may be aligned to the rear surface of the first wafer 1100. In yet another embodiment, an interposer may be used to stack two or more wafers.

In an embodiment of the present invention, the second wafer 1300 may be structurally similar (with regards to materials, layers, thicknesses, dimensions, and physical interconnections)) to the first wafer 1100. In another embodiment of the present invention, the second wafer 1300 may be functionally similar (with regard to underlying devices and equivalent electrical circuitry) to the first wafer 1100. Being similar does not mean being identical. In still another embodiment of the present invention, all or part of the layout of the raised contacts on the second wafer 1300 may be a mirror image of all or part of the layout of the raised contacts on the first wafer 1100. In yet another embodiment of the present invention, the second wafer 1300 and the first wafer 1100 may be structurally and functionally dissimilar.

After alignment, the raised contacts on the first wafer 1300 should be moved into close proximity to the corresponding raised contacts on the second wafer 1300. In an embodiment of the present invention, the first raised contact 138 on the first wafer 1100 is moved into close proximity to a corresponding second raised contact 338 on the second wafer 1300. The close proximity should be achieved in the lateral directions, such as in the x-direction and the y-direction, as well as in the vertical direction, such as in the z-direction. The z-direction lies in the direction of a spacing (S) 238 between the first raised contact 138 on the first wafer 1100 and the second raised contact 338 on the second wafer 1300, as shown in an embodiment of the present invention in FIG. 1K.

The design and the layout of the first raised contact 138 on the first wafer 1100 and the design and the layout of the second raised contact 338 on the second wafer 1300 should take into account the material properties of the respective wafers. The design and layout of the raised contacts 138, 338 should also take into account the process tolerances, including expected variation in, as well as typical changes to, important parameters, such as planarity, flatness, parallelism, and thickness.

The raised contacts 138, 338 may be designed and laid out with certain dimensions, or certain shapes, or certain redundancies, such as in a cluster or in an array, so as to enable good alignment of the wafers 1100, 1300 despite any distortion. The distortion may be elastic or inelastic. The distortion may be due to thermally-induced or mechanically-caused stresses.

Once the second raised contact 338 on the second wafer 1300 faces the corresponding first raised contact 138 on the first wafer 1100, the second wafer 1300 is lightly tacked in place over the ACP or the rear surface of the ACF 210. In an embodiment of the present invention, a light pressure, such as about 0.1–0.2 MPa, may be applied, such as in the z-direction, for a short duration, such as about 1–3 seconds, with no heat or with a low heat, such as at a temperature selected from a range of about 50–65 degrees Centigrade. Generation of bubbles or voids at an interface between the ACP, or the rear surface of the ACF 210, and the second wafer 1300 should be avoided.

Figure 1K:
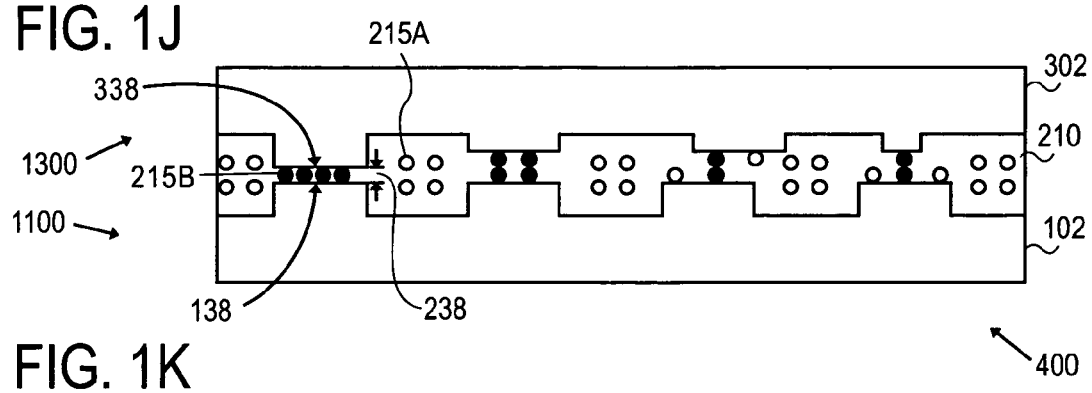

Next, the second wafer 1300 and the first wafer 1100 are moved towards each other to trap certain particles 215B from the ACP 210 or the ACF 210 in a group within a localized region between the second raised contact 338 on the second wafer 1300 and the first raised contact 138 on the first wafer 1100, as shown in an embodiment of the present invention in FIG. 1K.

In an embodiment of the present invention, a high pressure, such as about 1.5–4.0 MPa, may be applied, such as in the z-direction, for a long duration, such as about 5–20 seconds, with a high heat, such as at a temperature selected from a range of about 150–230 degrees Centigrade. In certain situations, the duration may be considerably longer, such as about 60–180 seconds.

In an embodiment of the present invention, the particles 215B that are trapped in the z-direction between the corresponding raised contacts 138, 338 facing each other may be locked, such as in a compressed state. Depending on the layout of the raised contacts on the two wafers, the bonding conditions, the alignment accuracy, and the particle elasticity, the particles 215B may be deformed by up to 25–30% of their nominal diameter.

After the ACP or the ACF 210 has been cured with appropriate pressure and heat, the trapped particles 215B in the group will form a continuous and conductive path between the second raised contact 338 on the second wafer 1100 and the first raised contact 138 on the first wafer 1100. In an embodiment of the present invention, about 1–6 trapped particles 215B may form the continuous and conductive path between the corresponding raised contacts 138, 338. The continuous and conductive path need not be in a straight line, need not lie in a plane, and need not be regular or symmetrical. In an embodiment of the present invention, the continuous and conductive path may be zig-zagged.

In an embodiment of the present invention, the contact resistance should be 1 milliohm or lower.

Other particles 215A that are not trapped in the group between the corresponding raised contacts 138, 338 facing each other will not form a continuous and conductive path. Thus, raised contacts that are not corresponding and do not face each other will not be shorted to each other. In an embodiment of the present invention, a ratio of untrapped particles 215A to trapped particles 215B may be about 3:1.

An embodiment of a stacked-substrate structure, such as a stacked-wafer structure 400, with ACA according to the present invention is also shown in FIG. 1K. The ACA may include an ACP or an ACF 210.

The ACA may include two or more components. One component may be a binder 214 that is adhesive and non-conductive. Another component may be a filler that may be changed by pressure and heat (thermocompression) from non-conductive 215A to conductive 215B. The ACF 210 may include a single layer or multiple layers.

The binder 214 may include a matrix. The matrix may include a polymer or a resin. The binder 214 for an ACP may be a thermoset, a thermoplastic, or a mixture of a thermoset and a thermoplastic. The binder 214 for an ACF 210 is usually a thermoset, such as an epoxy, a silicone, or a polyimide.

The binder 214 may act as an underfill between a first wafer 1100 and a second wafer 1300 with corresponding raised contacts 138, 338 that are connected by the ACA. Thus, it is desirable to match a CTE of the binder 214 reasonably closely to the CTE of the other materials on the first wafer 1100 and the second wafer 1300 in order to reduce any thermal stress that may be induced by a temperature excursion or a thermal gradient.

The other materials on the first wafer 1100 and the second wafer 1300 may include the substrate 102, the insulator 103, and the conductor 130, as shown in an embodiment of the present invention in FIG. 1F. The substrate 102, such as silicon, may have a CTE of about 24 ppm/K. The insulator 103, such as silicon oxide, may have a CTE of about 5–12 ppm/K. The conductor 130, such as copper, may have a CTE of about 12–23 ppm/K.

The binder 214 may have a CTE of about 12–20 ppm/K. The filler 215 may have a CTE of about 60–70 ppm/K. In an embodiment of the present invention, the ACA, such as a filled epoxy, may have a CTE of about 18–25 ppm/K.

The filler 215 may include particles that have a consistent shape. In one embodiment of the present invention, the particles may be spherical or globular, having a diameter (D) that is uniform. The diameter may be a nominal or an equivalent diameter if the particles are not spherical or globular.

In an embodiment of the present invention, the diameter of the particles in the ACP may be selected from a range of about 30–75 um. In another embodiment of the present invention, the diameter of the particles in the ACP may be selected from a range of about 12–30 um.

The particles in the ACF 210 may be smaller than the particles in the ACP. In an embodiment of the present invention, the diameter of the particles in the ACF 210 may be selected from a range of about 5–12 um. In another embodiment of the present invention, the diameter of the particles in the ACF 210 may be selected from a range of about 2–5 um.

In an embodiment of the present invention, the particle may include a conductive bulk material, such as a metal or an alloy. The metal or alloy may include nickel.

In another embodiment of the present invention, the particle may include a non-conductive bulk material, such as polystyrene, that is covered with a conductive outer layer, such as electroplated nickel-gold (Ni—Au).

In still another embodiment of the present invention, the particle may include a non-conductive bulk material, a conductive intermediate layer that covers the bulk material, and a non-conductive outer layer that has been moved aside or removed, such as with pressure and heat (thermocompression).

The concentration, or loading, of the filler 215 in the ACA should be controlled so that conductivity will be anisotropic (in the z-direction only). In an embodiment of the present invention, the loading of the filler 215 may be selected from a range of about 1–15% by volume in the ACA.

The distribution, or dispersion, of the filler 215 in the ACA may be random or ordered. The dispersion of the filler 215 in the ACA will be more uniform if clumping and settling out of the filler 215 are prevented. In an embodiment of the present invention, the filler 215 in the ACP should have a density that is close to a density of the binder 214. In another embodiment of the present invention, the filler 215 in the ACP should have a density that is close to 1 which is the density of water.

Each of the raised contacts may have dimensions that include a step height (H) 124, a width (W) 140, and a gap (G) 142 from an adjacent contact, as shown in an embodiment of the present invention in FIG. 1H. In certain localized regions of each wafer, some of the raised contacts may be arranged in a cluster or an array with a period, or pitch (P), that is defined as a sum of the width and the gap (W+G).

Typical dimensions for wafers stacked with the ACP are as follows. In a first embodiment of the present invention, H may have a value of about 0.25–2.50 um. In a second embodiment of the present invention, W may have a value of about 50–90 um. In a third embodiment of the present invention, G may have a value of about 50–110 um. In a fourth embodiment of the present invention, P may have a value of about 100–200 um. In an embodiment of the present invention, a ratio of (D/H) may be about 8 or more. In another embodiment of the present invention, a ratio of (D/W) may be about 0.8 or less. In still another embodiment of the present invention, a ratio of (D/G) may be about 1.0 or less.

Typical dimensions for wafers stacked with the ACF 210 are as follows. In a first embodiment of the present invention, H may have a value of about 0.25–2.50 um. In a second embodiment of the present invention, W may have a value of about 20–45 um. In a third embodiment of the present invention, G may have a value of about 10–30 um. In a fourth embodiment of the present invention, P may have a value of about 30–75 um. In an embodiment of the present invention, a ratio of (D/H) may be about 4 or more. In another embodiment of the present invention, a ratio of (D/W) may be about 0.3 or less. In still another embodiment of the present invention, a ratio of (D/G) may be about 0.5 or less.

In an embodiment of the present invention, the ACA has a bondline thickness (T) 238, measured between the corresponding raised contacts which face each other, that is selected from a range of about 6–14 um. In another embodiment of the present invention, the ACP or ACF 210 has a bondline thickness (T) 238, measured between the corresponding raised contacts which face each other, that is selected from a range of about 14–33 um. In still another embodiment of the present invention, the ACP or the ACF 210 has a ratio of (T/D) of 1.0–5.0.

The ACA connects a first raised contact 138 on a first wafer 1100 with a corresponding second raised contact 338 on a second wafer 1300. The first raised contact 138 on the first wafer 1100 faces the corresponding second raised contact 338 on the second wafer 1300. In an embodiment of the present invention, the second wafer 1300 may be structurally similar to the first wafer 1100. In another embodiment of the present invention, the second wafer 1300 may be functionally similar to the first wafer 1100. In still another embodiment of the present invention, the second wafer 1300 and the first wafer 1100 may be may be structurally and functionally dissimilar.

The design and the layout of the first raised contact 138 on the first wafer 1100 and the design and the layout of the second raised contact 338 on the second wafer 1300 should take into account the material properties of the respective wafers. The design and layout of the raised contacts 138, 338 should also take into account the process tolerances, including expected variation in, as well as typical changes to, important parameters, such as planarity, flatness, parallelism, and thickness.

The raised contacts 138, 338 may be designed and laid out with certain dimensions, or certain shapes, or certain redundancies, such as in a cluster or in an array, so as to enable good alignment of the wafers 1100, 1300 despite any distortion. The distortion may be elastic or inelastic. The distortion may be due to thermally-induced or mechanically-caused stresses.

The x-direction and the y-direction lie in the plane of the ACA. The z-direction lies in the direction of a spacing (S) 238 between the first raised contact 138 on the first wafer 1100 and the second raised contact 338 on the second wafer 1300, as shown in an embodiment of the present invention in FIG. 1K.

In an embodiment of the present invention, the particles 215B that are trapped in the z-direction between the corresponding raised contacts 138, 338 facing each other may be locked, such as in a compressed state. Depending on the bonding conditions, the alignment accuracy, and the particle elasticity, the particles 215B may be deformed by up to about 25–30% of their nominal diameter.

The trapped particles 215B form a continuous and conductive path between the second raised contact 338 on the second wafer 1100 and the first raised contact 138 on the first wafer 1100. In an embodiment of the present invention, about 1–6 trapped particles 215B may form the continuous and conductive path between the corresponding raised contacts 138, 338. The continuous and conductive path need not be in a straight line, need not lie in a plane, and need not be regular or symmetrical. In an embodiment of the present invention, the continuous and conductive path may be zig-zagged.

In an embodiment of the present invention, the contact resistance should be about 1 milliohm or lower.

Other particles 215A that are not trapped between the corresponding raised contacts 138, 338 facing each other do not form a continuous and conductive path. Thus, raised contacts that are not corresponding and do not face each other will not be shorted to each other. In an embodiment of the present invention, a ratio of untrapped particles 215A to trapped particles 215B may be about 3:1.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of using anisotropic conductive adhesive to stack wafers and a wafer-stacking structure having anisotropic conductive adhesive.

We claim:

1. A structure comprising:
an anisotropic conductive film, said anisotropic conductive film comprising multiple layers, said anisotropic conductive film comprising a front surface and a rear surface, said anisotropic conductive film comprising particles of a consistent shape, said particles comprising a non-conductive bulk material, a conductive intermediate layer, and a non-conductive outer layer wherein said non-conductive outer layer maybe moved aside by pressure;
a first raised contact disposed over said front surface, said first raised contact forming part of a first wafer; and
a second raised contact disposed over said rear surface, said second raised contact forming part of a second wafer, wherein said second raised contact faces said first raised contact.

2. The structure of claim 1 wherein said anisotropic conductive film comprises certain particles that are trapped between said first raised contact and said second raised contact, said certain particles that are trapped being deformed by up to about 25–30% of their nominal diameter.

3. The structure of claim 2 wherein said particles that are trapped between said first raised contact and said second raised contact form a continuous and conductive path, said continuous and conductive pat being zig-zagged.

4. The structure of claim 3 wherein said particles that are not trapped between said first raised contact and said second raised contact do not form a continuous and conductive path.

5. The structure of claim 2 wherein said anisotropic conductive film further comprises other particles that are not trapped between said first raised contact and said second raised contact wherein a ratio of said untrapped particles to said trapped particles may be about 3:1.

6. A stacked-substrate structure comprising:
a first substrate with a first surface, said first surface having a first raised contact;
an anisotropic conductive adhesive disposed over said first surface, said anisotropic conductive adhesive comprising a hinder and a filler, said filler including particles with a consistent shape; and
a second substrate with a second surface, said second surface having a second raised contact, said second surface disposed over said anisotropic conductive adhesive, wherein said second raised contact faces said first raised contact, wherein some of said particles are trapped between said second raised contact and said first raised contact to form a continuous and conductive path, and wherein said trapped particles may be locked in a compressed state.

7. The stacked-substrate structure of claim 6 wherein said first surface is a front surface and said second surface is a front surface.

8. The stacked-substrate structure of claim 6 wherein said first surface is a front surface and said second surface is a rear surface.

9. The stacked-substrate structure of claim 6 wherein said first surface is a rear surface and said second surface is a rear surface.

10. The stacked-substrate structure of claim 6 wherein said first substrate and said second substrate are structurally similar.

11. The stacked-substrate structure of claim 6 wherein said first substrate and said second substrate are functionally similar.

12. The stacked-substrate structure of claim 6 wherein said first substrate and said second substrate are structurally and functionally dissimilar.

13. The stacked-substrate structure of claim 6 wherein said first substrate and said second substrate are pre-thinned.

14. The stacked-substrate structure of claim 6 wherein said first substrate and said second substrate are wafers.

15. The stacked-substrate structure of claim 6 wherein said first substrate and said second substrate are portions of wafers.

* * * * *